United States Patent [19]
Takahashi

[11] Patent Number: 5,767,545
[45] Date of Patent: Jun. 16, 1998

[54] POWER MOSFET HAVING CURRENT DETECTION MEANS

[75] Inventor: Mitsuasa Takahashi, Tokyo, Japan

[73] Assignee: NEC Corporation, Tokyo, Japan

[21] Appl. No.: 781,813

[22] Filed: Jan. 9, 1997

[30] Foreign Application Priority Data

Jan. 9, 1996 [JP] Japan ................................ 8-001146

[51] Int. Cl.$^6$ ................................................ H01L 29/76
[52] U.S. Cl. .......................... 257/341; 257/368; 323/316; 327/427
[58] Field of Search ........................ 257/341, 365, 257/368, 369, 379; 323/316; 327/427

[56] References Cited

U.S. PATENT DOCUMENTS

| | | | |
|---|---|---|---|
| 4,553,084 | 11/1985 | Wrathall | 323/316 |
| 4,908,682 | 3/1990 | Takahashi | 357/23.4 |
| 4,962,411 | 10/1990 | Tokura, et al. | 357/23.4 |
| 5,153,696 | 10/1992 | Kayama | 357/41 |
| 5,422,593 | 6/1995 | Fujihira | 327/427 |

FOREIGN PATENT DOCUMENTS 2-208977  8/1990  Japan.

*Primary Examiner*—Mark V. Prenty
*Attorney, Agent, or Firm*—Foley & Lardner

[57] ABSTRACT

A power MOSFET includes a main MOSFET connected in series with a load resistor between a high voltage power supply voltage and ground, and a series circuit connected in parallel to the main MOSFET and composed of a sensing MOSFET and a converting MOSFET for converting a shunted current flowing through the sensing MOSFET into a detected voltage signal, which is supplied to one input of an operational amplifier. A gate of the main MOSFET and a gate of the sensing MOSFET are connected in common to an output of a gate drive circuit. The other input of the operational amplifier is connected to a reference voltage, so that the detected voltage signal is compared with the reference voltage. An output of the operational amplifier is fed back to the gate drive circuit, so that the gate drive circuit controls a gate voltage supplied to the gate of the main MOSFET and the gate of the sensing MOSFET, in order to prevent an overcurrent from flowing through the power MOSFET.

18 Claims, 4 Drawing Sheets

V_G-I_D CHARACTERISTICS OF MOSFET

POWER MOSFET HAVING CURRENT DETECTION MEANS

BACKGROUND OF THE INVENTION

1. Field of the Invention

The present invention relates to a semiconductor device having a current detection means, and more specifically to a power MOSFET having a means for detecting a current of the power MOSFET.

2. Description of Related Art

In a power MOSFET (metal-oxide-semiconductor field effect transistor), a current is monitored and controlled to prevent the transistor from being broken due to an overcurrent. Here, it is to be noted that the power MOSFET is constituted of a number of parallel-connected vertical-type elementary MOSFETs, each called a "cell". For monitoring the current, it is a conventional practice that, some of the elementary MOSFETs is used as a current monitoring cell, and a portion of a load current shunted to the current monitoring cell is detected.

Referring to FIG. 1, there is shown a diagrammatic partial sectional view of the prior art power MOSFET. The shown portion of the power MOSFET includes one main FET cell Q11A for flowing a major portion of a load current, and one sensing FET cell Q12A for monitoring the load current. In the actual power MOSFET, a main MOSFET is constituted of a number of (for example, one hundred to several thousands) parallel-connected main FET cells having the same construction as that of the shown main FET cell Q11A, and a sensing MOSFET is constituted of one to a few sensing FET cells having the same construction as that of the sensing PET cell Q12A.

As shown in FIG. 1, the shown power MOSFET includes an $n^+$ drain region 11 constituted of a semiconductor substrate, and an $n^-$ drain region 12 formed on the $n^+$ drain region 11. In a surface portion of the $n^-$ drain region 12, base regions 13 and 13A of a p-type conductivity are formed separately from each other, which constitute a channel region In a surface portion of each of the base regions 13 and 13A, an annular source region 14 and 14A of an n-type conductivity is formed.

On the substrate, furthermore, a gate electrode 15 surrounded by an insulator film 16 is formed to bridge adjacent respective source regions formed in adjacent base regions. Source electrodes 17 and 18 are formed on the substrate in such a manner that a source electrode 17 is in contact with the base region 13 and the source region 14, and a source electrode 18 is in contact with the base region 13A and the source region 14A. On a rear surface of the substrate, a drain electrode 19 is formed in common to all the cells.

Referring to FIG. 2, there is shown an equivalent circuit diagram of the power MOSFET having the prior art current detecting circuit. As shown in FIG. 2, a series-circuit composed of the sensing MOSFET Q12 and a current detecting resistor R4 is connected in parallel to the main MOSFET Q11, so that a portion of a current flowing through a load resistor R1 is shunted into the sensing MOSFET Q12. A gate of the main MOSFET Q11 and a gate of the sensing MOSFET Q12 are connected in common to an output terminal of a gate drive circuit 1.

A current flowing through the sensing MOSFET Q12 is converted into a voltage by means of the current detecting resistor R4, and the obtained voltage is supplied to one input of an operational amplifier 2, which in turn has the other input connected to receive a reference voltage Vref. An output of the operational amplifier 2 is fed back to the gate drive circuit 1, so that an overcurrent is prevented from flowing through the main MOSFET Q11 and the load resistor R1.

In the power MOSFET having the above mentioned construction (called a "first prior art example" hereinafter), since the detected voltage value is in proportion to the current value, it is not possible to obtain a large detected voltage value, and in addition, there occurs a so-called "less significant digit missing" in which a second significant digit and succeeding less significant digits of the detected value are invalidated because of an offset of the operational amplifier. As a result, it is not possible to detect the current value with a high degree of precision.

In order to overcome this drawback, Japanese Patent Application Laid-Open Publication No. JP-A-2-208977 proposes to use a current source composed of a function FET (JFET), in place of the current detecting resistor.

Referring to FIG. 3, there is shown an equivalent circuit diagram of the power MOSFET disclosed in JP-A-2-208977 (called a "second prior art example" hereinafter). In FIG. 3, elements similar to those shown in FIG. 2 are given the same Reference Numerals and Signs, and explanation thereof will be omitted. As seen from FIG. 3, the second prior art example includes a constant current source CS in place of the current detecting resistor R4. This constant current source CS is constituted of a depletion JFET having a drain connected to a source of the sensing MOSFET Q12, and a source and a gate connected in common to a low potential power supply terminal (ground).

In this power MOSFET, if a pinchoff starting current of the JFET (constituting the constant current source) is set to an overcurrent detecting value, as shown in FIG. 4, it is possible to obtain a large current detection signal Vc when an overcurrent is detected.

In the above mentioned first prior art example, since the resistor is used as the current-to-voltage converting means, it is not possible to detect the current with a high degree of precision. In the second prior art example, on the other hand, since the JFET is used as the current-to-voltage converting means, it is possible to detect the current with a high degree of sensitivity. However, the second prior art example has the following problems:

First, since it is necessary to form the JFET within the MOS semiconductor device, a manufacturing process inevitably becomes complicated. In general, a characteristics variation of the JFET is apt to be large in comparison with that of the MOSFET. In addition, since it is difficult to form the JFET by using a bulk in an integrated semiconductor device, it is necessary to form the JFET by using a polysilicon, with the result that the characteristics of the current-to-voltage converting means constituted of the JFET inevitably has a considerably large variation.

As mentioned above, in the second prior art example, since the current set value for detecting the overcurrent is set to the pinchoff starting current of the JFET, an absolute precision of the pinchoff starting current of the JFET is required in order to realize a high precision current detection. As mentioned just above, since it is difficult to maintain the degree of variation in characteristics of the JFET at an acceptable small value, it is resultantly impossible to realize the current detection having a high degree of precision.

In addition, as seen from FIG. 4, since the voltage rising in the current-voltage characteristics is abrupt, the second prior art example cannot change the detection current value by changing the reference voltage Vref applied to the operational amplifier. Therefore, the second prior art example has poor versatility, and therefore, it is difficult to freely use.

SUMMARY OF THE INVENTION

Accordingly, it is an object of the present invention to provide a power MOSFET device which has overcome the above mentioned defects of the conventional ones.

Another object of the present invention is to provide a power MOSFET device having a means for detecting a load current of the power MOSFET with a high degree of sensitivity and a high degree of precision, which can be easily manufactured and which can easily modify the set value of the overcurrent detecting value.

The above and other objects of the present invention are achieved in accordance with the present invention by using a MOSFET as a current-to-voltage converting means for detecting a current value.

Specifically, according to the present invention, there is provided a power MOSFET device including a main MOSFET connected between a high voltage power supply side terminal and a low voltage power supply side terminal, and a series circuit composed of a sensing MOSFET and a current-to-voltage converting means, the series circuit being connected in parallel to the main MOSFET, the sensing MOSFET having a gate connected to a gate of the main MOSFET, the improvement characterized in that the current-to-voltage converting means is constituted of a MOSFET.

Preferably, the current-to-voltage converting MOSFET has a gate and a drain connected to each other. More specifically, a back gate of the current-to-voltage converting MOSFET is connected to the above mentioned low voltage power supply side terminal.

In addition, the power MOSFET device further includes a reference voltage generating MOSFET having a gate and a drain connected to each other, and a voltage comparing means having a first input connected to receive an output voltage of the current-to-voltage converting means and a second input connected to a reference voltage generated by the reference voltage generating MOSFET.

In the power MOSFET device thus constructed, since it is possible to use, as a detection voltage value, a voltage not less than a threshold of the MOSFET, namely, since it is possible to utilize, as the detection voltage value, a voltage which is sufficiently larger than the offset of the operational amplifier, it is possible to realize the current detection having a high degree of precision.

Furthermore, since the current-voltage characteristics of the MOSFET constituting the current-to-voltage converting means is not so abrupt in comparison with that of the JFET, it is possible to suitably modify the overcurrent detecting value by changing the reference voltage to be compared with the output voltage of the current-to-voltage converting means.

Furthermore, in the case that the reference voltage generating MOSFET has a construction similar to that of the current-to-voltage converting MOSFET, variation of the characteristics of the current-to-voltage converting MOSFET is compensated by the reference voltage generating MOSFET, so that a more precise detection can be realized.

The above and other objects, features and advantages of the present invention will be apparent from the following description of preferred embodiments of the invention with reference to the accompanying drawings.

DESCRIPTION OF THE PREFERRED EMBODIMENTS

Figure 2:
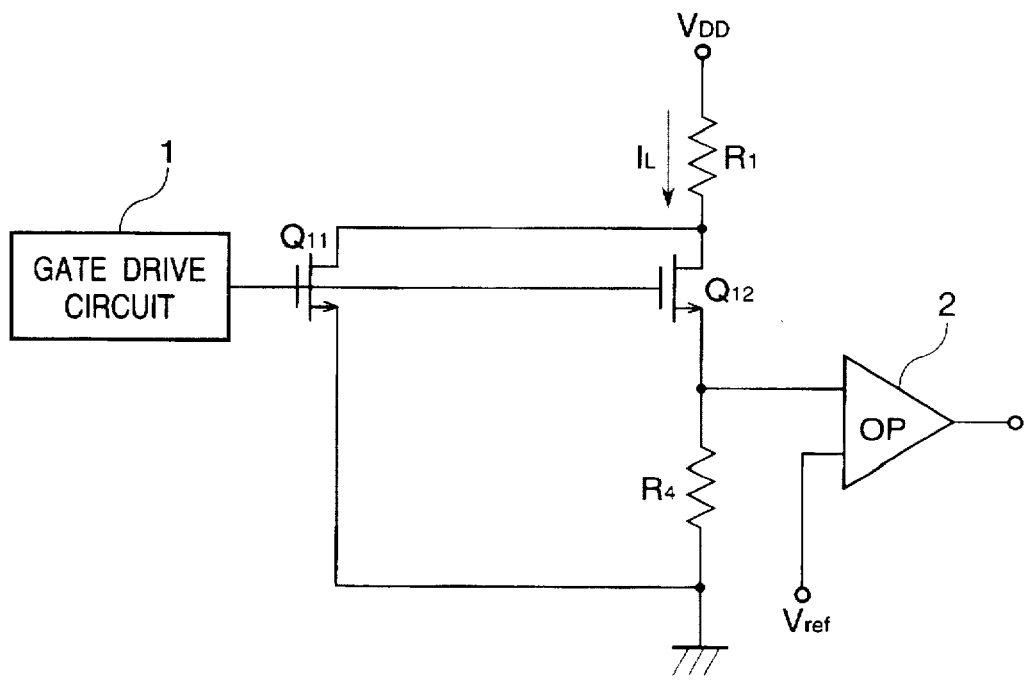
FIG. 2 is an equivalent circuit diagram of a first example of the power MOSFET having the prior art current detecting circuit.
Figure 3:
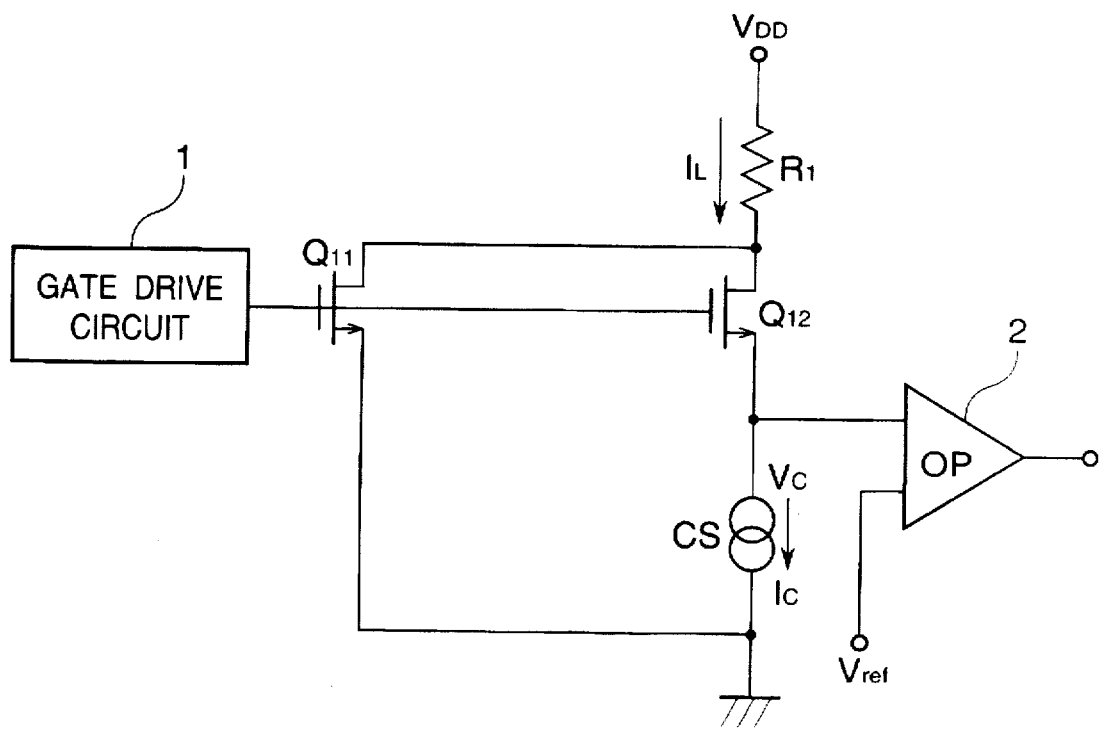
FIG. 3 is an equivalent circuit diagram of a second example of the power MOSFET having the prior art current detecting circuit.
Figure 5:
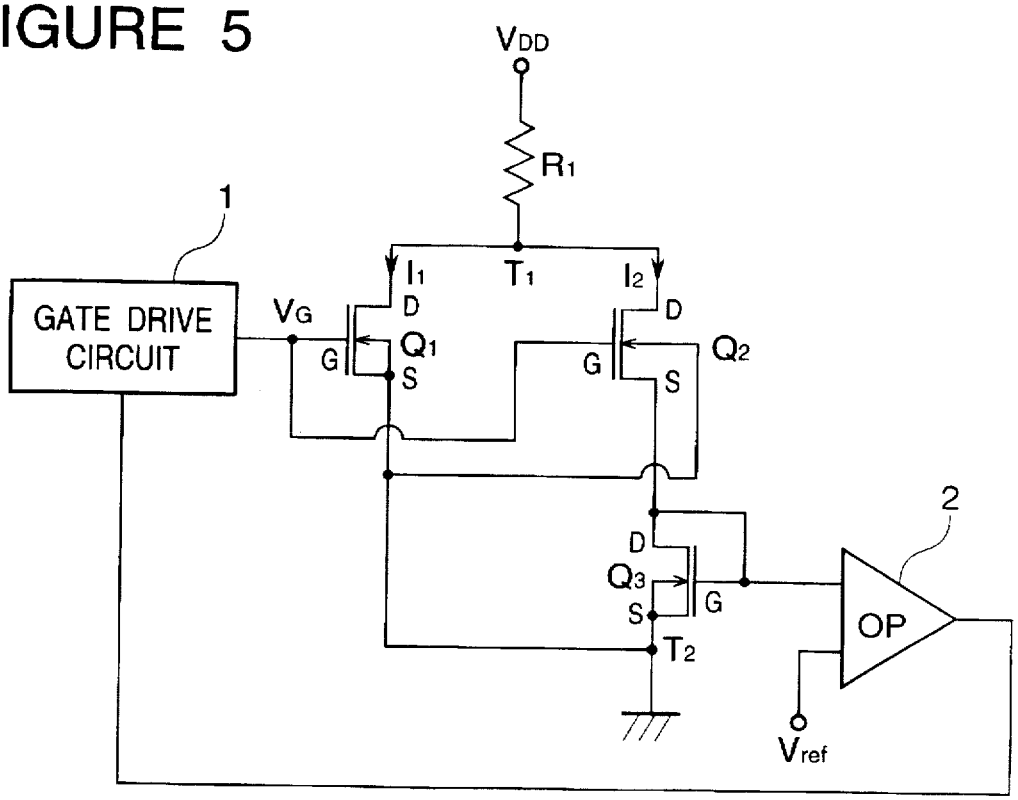
FIG. 5 is an equivalent circuit diagram of a first embodiment of the power MOSFET having tie current detecting circuit in accordance with the present invention.

Referring to FIG. 5, there is shown an equivalent circuit diagram of a first embodiment of the power MOSFET having the current detecting circuit in accordance with the present invention. In FIG. 5, elements similar to those shown in FIG. 2 are given the same Reference Numerals and Signs.

The shown embodiment includes a load resistor R1 and a main MOSFET Q1 of an n-channel enhancement type for flowing a main current I1, having a drain connected at a first terminal T1 to the load resistor R1 and a source connected to a second terminal T2. The load resistor R1 and the main MOSFET Q1 are connected in series between a high voltage power supply voltage VDD and a low voltage power supply voltage (ground). In parallel to the main MOSFET Q1, namely, between the first terminal T1 and the second terminal T2, a series circuit is connected which is composed of a sensing MOSFET Q2 of an n-channel enhancement type for flowing a shunted current I2 on the order of 1/n of the main current I1 (where "n" is one hundred to several thousands), and a converting MOSFET Q3 of an n-channel enhancement type for converting the shunted current I2 into a voltage signal.

Figure 1:
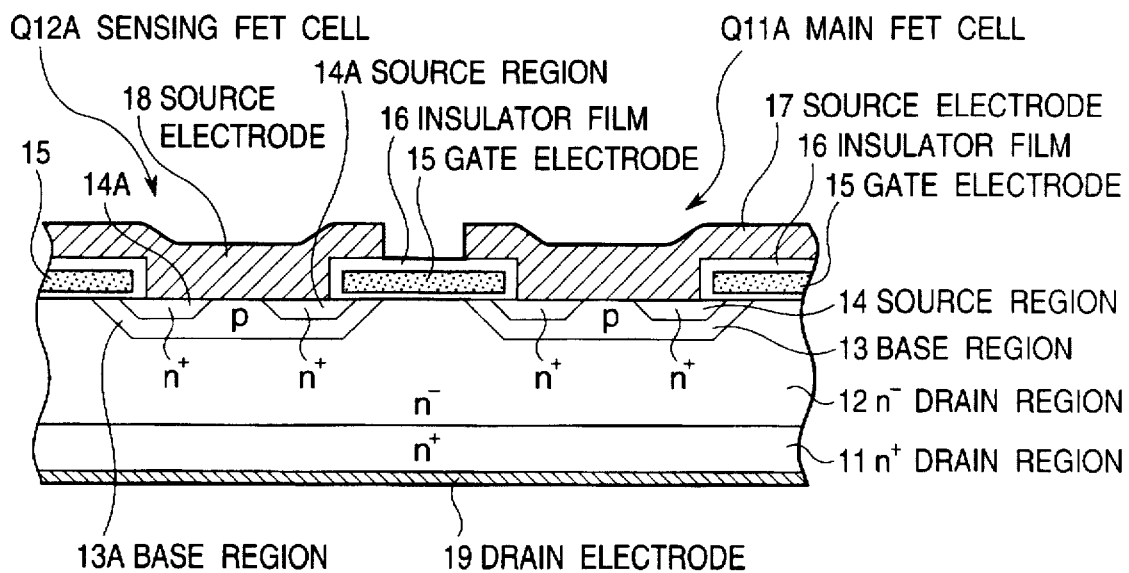
FIG. 1 is a diagrammatic partial sectional view of the prior art power MOSFET.

A gate of the main MOSFET Q1 and a gate of the sensing MOSFET Q2 are connected in common to receive a gate voltage VG outputted from a gate drive circuit 1. A back gate of the main MOSFET Q1 (which is formed of a region corresponding to the base region 13 shown in FIG. 1) and a back gate of the sensing MOSFET Q2 (which is formed of a region corresponding to the base region 13A shown in FIG. 1) are connected in common at the second terminal T2 to the low voltage power supply voltage (ground). This back gate connection of the sensing MOSFET Q2 is effective in elevating the detection precision of the shunted current, as disclosed in U.S. Pat. No. 4,908,682, the disclosure of which is incorporated by reference in its entirety into this application.

A gate of the converting MOSFET Q3 is connected to a connection node between a source of the sensing MOSFET Q2 and a drain of the converting MOSFET Q3, the connection node constituting an output node of this current detecting circuit. A back gate of the converting MOSFET Q3 is connected together with a source of the converting MOSFET Q3 at the second terminal T2 to the low voltage power supply voltage (ground).

The output node of the current detecting circuit is connected to one input of an operational amplifier 2, which in turn has the other input connected to receive a reference voltage Vref, so that the output voltage of the current detecting circuit is compared with the reference voltage Vref. The operational amplifier 2 outputs to the gate drive circuit 1 all output voltage indicating which it is, an overcurrent condition or a normal condition. If it is in the overcurrent condition, the gate drive circuit 1 lowers the gate voltage VG supplied to the gate of the MOSFETs Q1 and Q2, so that the main current I1 and the shunted current I2 decrease, whereby the main MOSFET Q1 and the sensing MOSFET Q2 are protected from the break or destroy caused by the overcurrent Referring to FIG. 6, there is shown an equivalent circuit diagram of an example of a reference voltage generating circuit which generates the reference voltage Vref supplied to the operational amplifier 2 in the first embodiment shown in FIG. 5. The reference voltage generating circuit includes a resistor R2 having one end connected to receive the gate voltage VG outputted from the gate drive circuit 1, and a Zener diode ZD having a cathode connected to the other end of the resistor R2 and an anode connected to the low voltage power supply voltage (ground) (namely, to the second terminal T2), so that a constant voltage is generated from the gate voltage VG.

The constant voltage obtained from a connection node between the resistor R2 and the Zener diode ZD is supplied to a series circuit constituted of a resistor R3 having one end connected to the connection node between the resistor R2 and the Zener diode ZD, and a reference voltage generating MOSFET Q4 of an n-channel enhancement type having a gate and a drain connected in common to the other end of the resistor R3 and a source and a back gate connected in common to the low voltage power supply voltage (ground) (namely, to the second terminal T2). Namely, the series circuit divides the constant voltage obtained from the connection node between the resistor R2 and the Zener diode ZD. A divided voltage obtained from a connection node between the resistor R3 and the reference voltage generating MOSFET Q4 is supplied as the reference voltage Vref.

Figure 6:
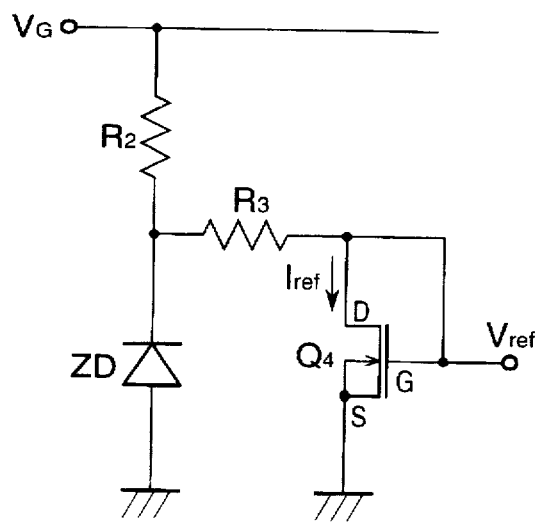
FIG. 6 is an equivalent circuit diagram of an example of a reference voltage generating circuit which can be used in combination with the first embodiment shown in FIG. 5.
Figure 7:
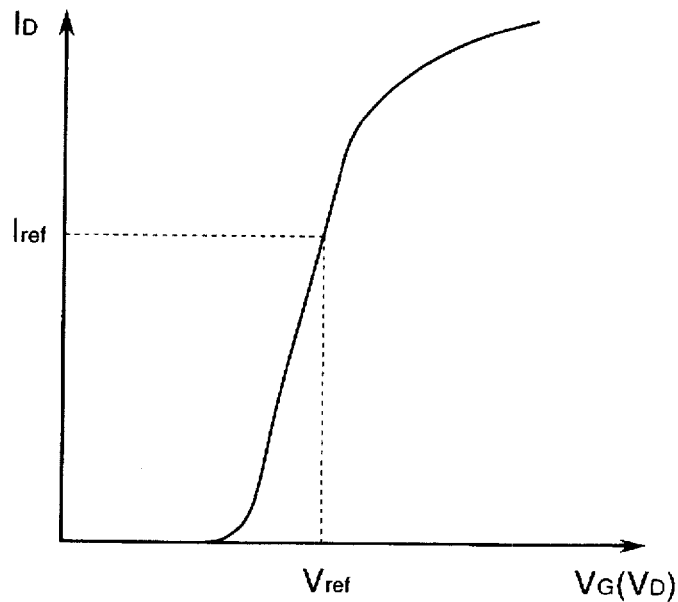
FIG. 7 is a graph showing a current-voltage characteristics of a reference voltage generating MOSFET, for illustrating an operation of the reference voltage generating circuit shown in FIG. 6.

FIG. 7 is a graph showing a voltage-current characteristics of the reference voltage generating MOSFET Q4 shown in FIG. 6.

Incidentally, the converting MOSFET Q3 has a voltage-current characteristics similar to that of the MOSFET Q4. This reference voltage generating MOSFET Q4 is so designed that a change of the characteristics caused by a temperature change is minimum at an operating point (Vref, Iref).

Under the existing semiconductor device manufacturing technology, even if the current I2 flowing through the converting MOSFET Q3 is constant, variation in the converted output voltage is inevitable because of variation in a manufacturing process of the converting MOSFET Q3. In this embodiment, therefore, since the reference voltage Vref is generated by the reference voltage generating MOSFET Q4 having a construction similar to that of the converting MOSFET Q3, namely, a characteristics similar to that of the converting MOSFET Q3, the reference voltage generating MOSFET Q4 has a characteristics variation similar to that of the converting MOSFET Q3, with the result that the characteristics variation of the converting MOSFET Q3 is compensated. Because, if the gate voltage of the converting MOSFET Q3 elevates because of the variation in the manufacturing process of the converting MOSFET Q3, the gate voltage of the reference voltage generating MOSFET Q4 similarly elevates because of the similar variation in the manufacturing process of the reference voltage generating MOSFET Q4, and to the contrary, if the gate voltage of the converting MOSFET Q3 lowers because of the variation in the manufacturing process of the converting MOSFET Q3, the gate voltage of the reference voltage generating MOSFET Q4 similarly lowers because of the similar variation in the manufacturing process of the reference voltage generating MOSFET Q4.

Figure 8:
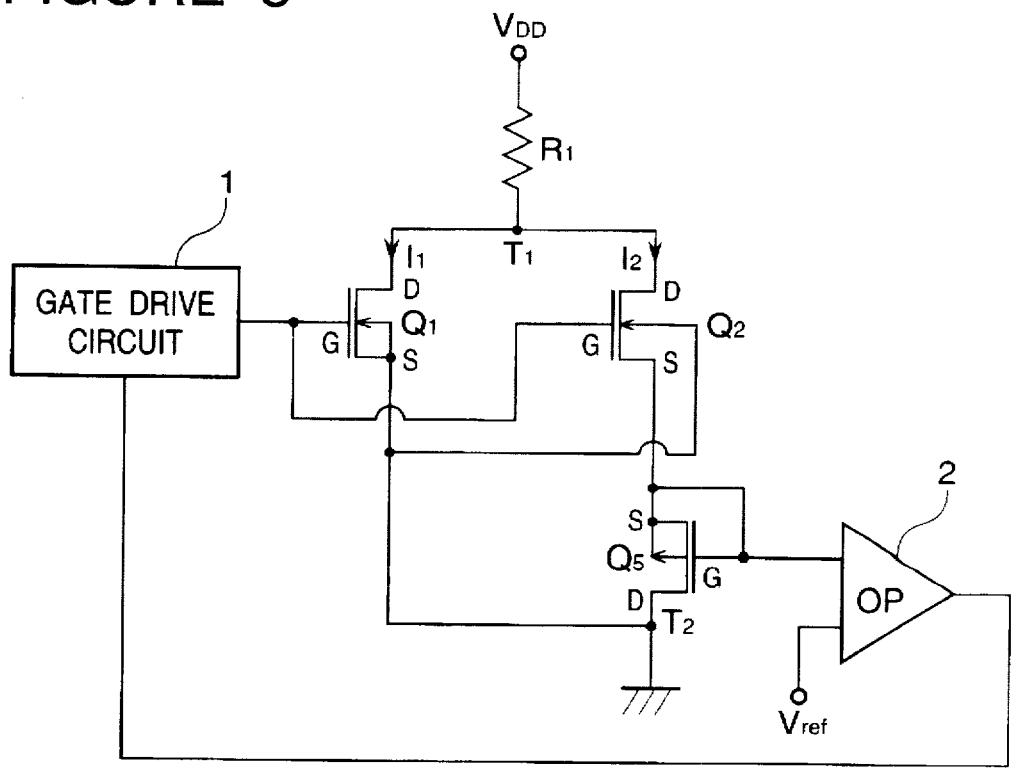
FIG. 8 is an equivalent circuit diagram of a second embodiment of the power MOSFET having the current detecting circuit in accordance with the present invention.

Referring to FIG. 8, there is shown an equivalent circuit diagram of a second embodiment of the power MOSFET having the current detecting circuit in accordance with the present invention. In FIG. 8, elements similar to those shown in FIG. 5 are given the same Reference Numerals and Signs, and explanation thereof will be omitted.

As seen from comparison between FIGS. 5 and 8, the converting MOSFET Q3 shown in FIG. 5 is replaced by a p-channel depletion MOSFET Q5, which has a drain connected to the low voltage power supply voltage (ground) (namely, to the second terminal T2), and a source, a gate and a back gate connected in common to the source of the sensing MOSFET Q2. An operation of the second embodiment is similar to that of the first embodiment, and therefore, explanation will be omitted.

Figure 9:
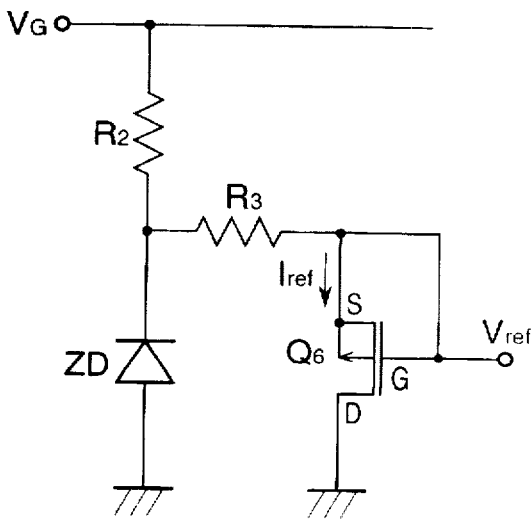
FIG. 9 is an equivalent circuit diagram of an example of a reference voltage generating circuit which can be used in combination with the second embodiment shown in FIG. 8.

Referring to FIG. 9, there is shown an equivalent circuit diagram of an example of a reference voltage generating circuit which can be used in combination with the second embodiment shown in. FIG. 8. In FIG. 9, elements similar to those shown in FIG. 6 are given the same Reference Numerals and Signs, and explanation thereof will be omitted.

As seen from comparison between FIGS. 6 and 9, the reference voltage generating MOSFET Q4 shown in FIG. 6 is replaced by a p-channel depletion MOSFET Q6, which has a drain connected to the low voltage power supply voltage (ground) (namely, to the second terminal T2), and a source, a gate and a back gate connected in common to the other end of the resistor R3. An operation of the reference voltage generating circuit shown in FIG. 9 is similar to that of the reference voltage generating circuit shown in FIG. 6, and therefore, explanation will be omitted.

In the above mentioned embodiments, both the main MOSFET and the sensing MOSFET are formed of the n-channel type, but, it would be a matter of course to persons skilled in the art that the main MOSFET and the sensing MOSFET can be formed of the p-channel type. In this connection, since how to substitute a p-channel MOSFET for an n-channel MOSFET is apparent to to persons skilled in the art, there will be omitted an explanation of a construction and an operation of embodiments that the main MOSFET and the sensing MOSFET can be formed of the p-channel type.

As seen from the above, since the power MOSFET in accordance with the present invention is characterized in that the current shunted into the sensing MOSFET is converted into a voltage signal by the converting MOSFET, even if the shunted current is very small, the shunted current can be converted into a voltage not less than the threshold voltage of the converting MOSFET. Here, it is possible to set the threshold voltage of the converting MOSFET to a voltage not less than 1 V. On the other hand, in the case that a current detecting resistor is used as in the first prior art example, only the detection voltage on the order of several 10 mV can be obtained. Therefore, the "less significant digit missing", which inevitably occurs in the first prior art example, does not occur in the power MOSFET in accordance with the present invention. Thus, the present invention can remarkably elevate the degree of detection precision, in comparison with the first prior art example.

In addition, since the MOSFET is used for the current-to-voltage conversion, it is possible to realize the current detection with a precision higher than that of the second prior art example using the JFET which is difficult to obtain the absolute precision of the pinchoff starting current of the JFET.

Figure 4:
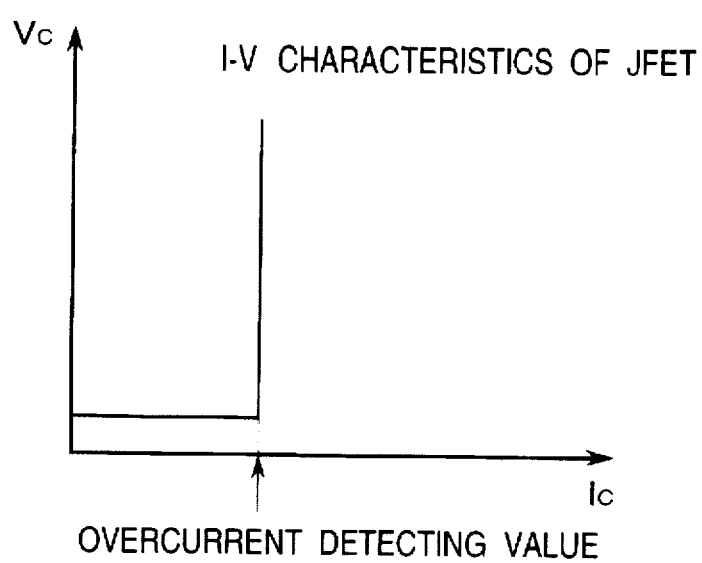
FIG. 4 is a graph showing a current-voltage characteristics of the JFET.

Furthermore, since the converting MOSFET has the current-voltage characteristics as shown in FIG. 7, similarly to the reference voltage generating MOSFET, the voltage rising curve of the current-voltage characteristics is not so abrupt, differently from that of the JFET as shown in FIG. 4. Accordingly, by changing the value of the reference voltage Vref, it is possible to modify the overcurrent detecting value. Therefore, the circuit has high versatility.

Moreover, if the reference voltage Vref is generated by the reference voltage generating MOSFET having the construction similar to that of the converting MOSFET, the variation of the characteristics of the converting MOSFET can be compensated by the reference voltage generating MOSFET. Accordingly, the degree of detection precision can be further elevated.

The invention has thus been shown and described with reference to the specific embodiments. However, it should be noted that the present invention is in no way limited to the details of the illustrated structures but changes and modifications may be made within the scope of the appended claims.

I claim:

1. A power MOSFET device comprising:
   a main MOSFET connected between a high voltage power supply side terminal and a low voltage power supply side terminal; and
   a series circuit composed of a sensing MOSFET and a current-to-voltage converting means, said series circuit being connected in parallel to said main MOSFET, said sensing MOSFET having a gate connected to a gate of said main MOSFET,
   wherein said current-to-voltage converting means includes an enhancement type MOSFET that has a gate and a drain connected to each other.

2. A power MOSFET device claimed in claim 1 wherein a back gate of said MOSFET constituting said current-to-voltage converting means is connected to said low voltage power supply side terminal.

3. A power MOSFET device claimed in claim 1, further including a reference voltage generating MOSFET having a gate and a drain connected to each other, and a voltage comparing means having a first input connected to receive an output voltage of said current-to-voltage converting means and a second input connected to a reference voltage generated by said reference voltage generating MOSFET.

4. A power MOSFET device claimed in claim 1, further including a reference voltage generating MOSFET having a gate and a source connected to each other, and a voltage comparing means having a first input connected to receive an output voltage of said current-to-voltage converting means and a second input connected to a reference voltage generated by said reference voltage generating MOSFET.

5. A Power MOSFET device claimed in claim 1, further including a reference voltage generating means which includes
   a first resistor having one end connected to receive said gate of said main MOSFET,
   a Zener diode having a cathode connected to the other end of said first resistor and an anode connected to said low voltage power supply side terminal,
   a second resistor having one end connected to said cathode of said Zener Diode,
   a reference voltage generating MOSFET having a drain and a gate connected in common to the other end of said second resistor and a source and a back gate connected in common to said low voltage power supply side terminal, and
   a voltage comparing means having a first input connected to receive an output voltage of said current-to-voltage converting means and a second input connected to a reference voltage outputted from a connection node between said second resistor and said reference voltage generating MOSFET,
   wherein said reference generating MOSFET has a current-voltage characteristics similar to said enhancement type MOSFET.

6. A power MOSFET device claimed in claim 1, further including a reference voltage generating means which includes
   a first resistor having one end connected to receive said gate of said main MOSFET,
   a Zener diode having a cathode connected to the other end of said first resistor and an anode connected to said low voltage power supply side terminal,
   a second resistor having one end connected to said cathode of said Zener diode,
   a reference voltage generating MOSFET having a source, a gate and a back gate connected in common to the other end of said second resistor and a drain connected in common to said low voltage power supply side terminal, and
   a voltage comparing means having a first input connected to receive an output voltage of said current-to-voltage converting means and a second input connected to a reference voltage outputted from a connection node between said second resistor and said reference voltage generating MOSFET,
   wherein said reference generating MOSFET has a current-voltage characteristics similar to said enhancement type MOSFET.

7. A power MOSFET device comprising:
   a first terminal and a second terminal which are connected in series with a load resistor between a high voltage power supply voltage and a low voltage power supply voltage;
   a main MOSFET having a pair of current path ends, a gate and a back gate, one of said pair of current path ends being connected to said first terminal, the other of said pair of current path ends being connected to said second terminal, said back gate being connected to a selected one of said first terminal and said second terminal;
   a series circuit composed of a sensing MOSFET and a converting MOSFET connected in series to each other, said series circuit being connected in parallel to said main MOSFET between said first terminal and said second terminal, said sensing MOSFET having a pair of current path ends, a gate and a back gate, one of said pair of current path ends being connected to one of said first terminal and said second terminal, said back gate being connected to said selected one of said first terminal and said second terminal, said converting MOSFET having a gate and a pair of current path ends, said gate and one of said pair of current path ends being connected to the other of said pair of current path ends of said sensing MOSFET, the other of said pair of current path ends of said converting MOSFET being connected to the other of said first terminal and said second terminal, so that a shunted current flowing through said sensing MOSFET is converted into a detected voltage signal at a connection node between said sensing MOSFET and said converting MOSFET; a gate drive means outputting a gate voltage, which is supplied in common to said gate of said main MOSFET and said gate of said sensing MOSFET, a reference voltage generating means having an output for generating a reference voltage; and a comparing means having a first input connected to said connection node between said sensing MOSFET and said converting MOSFET so as to receive said detected voltage signal, and a second input connected to said output of said reference voltage generating means to receive said reference voltage, for generating an output signal indicative of the result of comparison of said detected voltage signal with said reference voltage, said output signal being fed back to said gate drive means so that said gate drive means controls said gate voltage in order to prevent an overcurrent from flowing though the power MOSFET.

8. A power MOSFET device claimed in claim 7 wherein said converting MOSFET is an n-channel MOSFET having a drain and a gate connected in common to the other of said pair of current path ends of said sensing MOSFET, said source of said sensing MOSFET, and a source and a back gate connected in common to the other of said first terminal and said second terminal.

9. A power MOSFET device claimed in claim 7 wherein said converting MOSFET is a p-channel MOSFET having a source, a gate and a back gate connected in common to the other of said pair of current path ends of said sensing MOSFET, and a drain connected to the other of said first terminal and said second terminal.

10. A power MOSFET device claimed in claim 7 wherein said reference voltage generating means includes a first resistor having one end connected to receive said gate voltage outputted from said gate drive means, a Zener diode having a cathode connected to the other end of said first resistor and an anode connected to said second terminal, a second resistor having one end connected to said cathode of said Zener diode, and a reference voltage generating MOSFET having a drain and a gate connected in common to the other end of said second resistor and a source and a back gate connected in common to said second terminal, said reference voltage being outputted from a connection node between said second resistor and said reference voltage generating MOSFET, said reference voltage generating MOSFET having a current-voltage characteristics similar to said converting MOSFET.

11. A power MOSFET device claimed in claim 10 wherein said converting MOSFET is an n-channel MOSFET having a drain and a gate connected in common to the other of said pair of current path ends of said sensing MOSFET, and a source and a back gate connected in common to the other of said first terminal and said second terminal, and said reference voltage generating MOSFET is also an n-channel MOSFET.

12. A power MOSFET device claimed in claim 7 wherein said reference voltage generating means includes a first resistor having one end connected to receive said gate voltage outputted from said gate drive means, a Zener diode having a cathode connected to the other end of said first resistor and an anode connected to said second terminal, a second resistor having one end connected to said cathode of said Zener diode, and a reference voltage generating MOSFET having a source, a gate and a back gate connected in common to the other end of said second resistor and a drain connected to said second terminal, said reference voltage being outputted from a connection node between said second resistor and said reference voltage generating MOSFET, said reference voltage generating MOSFET having a current-voltage characteristics similar to said converting MOSFET.

13. A power MOSFET device claimed in claim 12 wherein said converting MOSFET is a p-channel MOSFET having a source, a gate and a back gate connected in common to the other of said pair of current path ends of said sensing MOSFET, and a drain connected to the other of said first terminal and said second terminal, and said reference voltage generating MOSFET is also a p-channel MOSFET.

14. A power MOSFET device comprising:

a first terminal and a second terminal which are connected in series with a load resistor between a high voltage power supply voltage and a low voltage power supply voltage;

a main MOSFET having a drain connected to said first terminal, and a source and a back gate connected in common to said second terminal;

a series circuit composed of a sensing MOSFET having a drain connected to said first terminal and a back gate connected to said second terminal, and a converting MOSFET having a pair of current path ends, a gate of said converting MOSFET being connected together with one of said pair of current path ends in common to a source of said sensing MOSFET, the other of said pair of current path ends being connected to said second terminal, so that a shunted current flowing through said sensing MOSFET is converted into a detected voltage signal at a connection node between said sensing MOSFET and said converting MOSFET;

a gate drive means outputting a gate voltage, which is supplied in common to a gate of said main MOSFET and a gate of said sensing MOSFET, a reference voltage generating means having an output for generating a reference voltage; and a comparing means having a first input connected to said connection node between said sensing MOSFET and said converting MOSFET so as to receive said detected voltage signal, and a second input connected to said output of said reference voltage generating means to receive said reference voltage, for generating an output signal indicative of the result of comparison of said detected voltage signal with said reference voltage, said output signal being fed back to said gate drive means so that said gate drive means controls said gate voltage in order to prevent an overcurrent from flowing through the power MOSFET.

15. A power MOSFET device claimed in claim 14 wherein said reference voltage generating means includes a first resistor having one end connected to receive said gate voltage outputted from said gate drive means, a Zener diode having a cathode connected to the other end of said first resistor and an anode connected to said second terminal, a second resistor having one end connected to said cathode of said Zener diode, and a reference voltage generating MOSFET having a drain and a gate connected in common to the other end of said second resistor and a source and a back gate connected in common to said second terminal, said reference voltage being outputted from a connection node between said second resistor and said reference voltage generating MOSFET, said reference voltage generating MOSFET having a current-voltage characteristics similar to said converting MOSFET.

16. A power MOSFET device claimed in claim 15 wherein said converting MOSFET is an n-channel MOSFET having a drain and a gate connected in common to said source of said sensing MOSFET, and a source and a back gate connected in common to said second terminal, and said reference voltage generating MOSFET is also an n-channel MOSFET.

17. A power MOSFET device claimed in claim 14 wherein said reference voltage generating means includes a first resistor having one end connected to receive said gate voltage outputted from said gate drive means, a Zener diode having a cathode connected to the other end of said first resistor and an anode connected to said second terminal, a second resistor having one end connected to said cathode of said Zener diode, and a reference voltage generating MOSFET having a source, a gate and a back gate connected in common to the other end of said second resistor and a drain connected to said second terminal, said reference voltage being outputted from a connection node between said second resistor and said reference voltage generating MOSFET, said reference voltage generating MOSFET having a current-voltage characteristics similar to said converting MOSFET.

18. A power MOSFET device claimed in claim 17 wherein said converting MOSFET is a p-channel MOSFET having a source, a gate and a back gate connected in common to said source of said sensing MOSFET, and a drain connected to said second terminal, and said reference voltage generating MOSFET is also a p-channel MOSFET.

* * * * *